United States Patent
Yoshida

(10) Patent No.: US 9,822,300 B2
(45) Date of Patent: *Nov. 21, 2017

(54) FLUORIDE FLUORESCENT MATERIAL AND METHOD FOR PRODUCING THE SAME AS WELL AS LIGHT EMITTING DEVICE USING THE SAME

(71) Applicant: NICHIA CORPORATION, Anan-shi, Tokushima (JP)

(72) Inventor: Tomokazu Yoshida, Anan (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 209 days.

This patent is subject to a terminal disclaimer.

(21) Appl. No.: 14/467,158

(22) Filed: Aug. 25, 2014

(65) Prior Publication Data

US 2015/0055060 A1 Feb. 26, 2015

(30) Foreign Application Priority Data

Aug. 26, 2013 (JP) ................................. 2013-174445

(51) Int. Cl.
*C09K 11/02* (2006.01)
*C09K 11/61* (2006.01)
(Continued)

(52) U.S. Cl.
CPC ............ *C09K 11/616* (2013.01); *H05B 33/14* (2013.01); *G02F 1/133603* (2013.01);
(Continued)

(58) Field of Classification Search
CPC ... C09K 11/025; C09K 11/616; C09K 11/617; C09K 11/665; C09K 2211/181;
(Continued)

(56) References Cited

U.S. PATENT DOCUMENTS 9,120,972 B2 * 9/2015 Yoshida ............... C09K 11/675
9,222,017 B2 * 12/2015 Yoshida ............... C09K 11/675
(Continued)

FOREIGN PATENT DOCUMENTS

JP 2011-012091 A 1/2011
JP 2011012091 A * 1/2011
(Continued)

OTHER PUBLICATIONS

Machine translation of JP2011012091A, printed Jun. 10, 2016.*
Office Action (with English translation) issued on Sep. 27, 2016, in Japanese Patent Application No. 2013-174445.

*Primary Examiner* — Matthew E Hoban
*Assistant Examiner* — Lynne Edmondson
(74) *Attorney, Agent, or Firm* — Andrews Kurth Kenyon LLP

(57) ABSTRACT

The present invention provides a method for producing a fluoride fluorescent material, the method comprising:
  contacting potassium ions with first complex ions comprising tetravalent manganese ions and second complex ions comprising at least one member selected from the group consisting of elements belonging to Groups 4 and 14 of the Periodic Table in a liquid medium comprising hydrogen fluoride to obtain a dispersion containing fluoride particles represented by the following formula (I):

$$K_2[M_{1-b}Mn^{4+}{}_bF_6] \qquad (I)$$

wherein M is the at least one member selected from the group consisting of elements belonging to Groups 4 and 14 of the Periodic Table, and b satisfies the relationship: 0<b<0.2;
  adding a reducing agent to the dispersion; and
  contacting the fluoride particles in the dispersion to which the reducing agent is added with at least one of addi-
(Continued)

tional second complex ions and additional potassium ions in the presence of hydrogen fluoride to obtain a fluoride fluorescent material.

8 Claims, 1 Drawing Sheet

(51) Int. Cl.
  *C09K 11/66*   (2006.01)
  *C09K 11/67*   (2006.01)
  *H05B 33/14*   (2006.01)
  *G02F 1/1335*   (2006.01)

(52) U.S. Cl.
  CPC ............. *G02F 2001/133614* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
  CPC ..... H01L 33/502; H01L 33/504; H05B 33/14;
    G02F 1/133603; G02F 2001/133614
  USPC ....... 252/301.4 F, 301.4 H; 313/503; 349/70,
    349/71; 427/213.3
  See application file for complete search history.

(56) References Cited

U.S. PATENT DOCUMENTS

2006/0169998 A1*  8/2006  Radkov ................ C09K 11/617
                257/98
2010/0142189 A1*  6/2010  Hong ................... C09K 11/616
                362/97.3
2012/0299466 A1   11/2012  Lyons et al.

FOREIGN PATENT DOCUMENTS

JP    2015-212398 A   11/2015
WO   2012/128837 A   9/2012

* cited by examiner

FLUORIDE FLUORESCENT MATERIAL AND METHOD FOR PRODUCING THE SAME AS WELL AS LIGHT EMITTING DEVICE USING THE SAME

CROSS-REFERENCE TO RELATED APPLICATIONS

This application claims priority under 35 USC 119 from Japanese patent Application No. 2013-174445, filed on Aug. 26, 2013, the disclosures of which are incorporated by reference herein.

BACKGROUND OF THE INVENTION

Field of the Invention

The present invention relates to a fluoride fluorescent material and a method for producing the same as well as a light emitting device using the same.

Description of the Related Art

A light emitting diode (LED) is a semiconductor light emitting element frequently used as a substitute for a conventional light source, and is useful as a display lamp, a warning lamp, and a lamp for indicator or lighting. Various types of light emitting devices emitting light of, e.g., white color, electric bulb color, or orange color have been developed, wherein the devices use a semiconductor light emitting element produced from a Group III-V semiconductor, such as gallium nitride (GaN), and a fluorescent material in combination. These light emitting devices emitting light of white color or the like is controlled in color tone by the principle of mixing colors of lights. As a system for emitting a white light, a system using a light emitting element emitting an ultraviolet light and three types of fluorescent materials respectively emitting red (R), green (G), and blue (B) lights, and a system using a light emitting element emitting a blue light and a fluorescent material emitting, e.g., a yellow light have been well known. A light emitting device of a system using a light emitting element emitting a blue light and a fluorescent material emitting, e.g., a yellow light is demanded in a wide variety of fields, such as a lighting, a car lighting, a display, and a backlight for liquid crystal. In these fields, the fluorescent material used in the display application is desired to have both excellent light emission efficiency and excellent intensity of color for reproducing colors in a wide range on the chromaticity coordinates. Further, the fluorescent material used in the display application is desired to be advantageously used in combination with a filter, and thus a fluorescent material exhibiting an emission spectrum having a narrow half band width is demanded.

For example, as a red light-emitting fluorescent material having an excitation band in the blue region, and exhibiting an emission spectrum having a narrow half band width, a fluoride fluorescent material activated by tetravalent manganese ions ($Mn^{4+}$), having a composition, such as $K_2TiF_6$:$Mn^{4+}$, $Ba_2TiF_6$:$Mn^{4+}$, $Na_2TiF_6$:$Mn^{4+}$, or $K_3ZrF_7$:$Mn^{4+}$, has been known (see, for example, Japanese Patent Application prior-to-examination Publication (kohyo) No. 2009-528429). In addition, a fluoride fluorescent material having a composition: $K_2SiF_6$:$Mn^{4+}$ has been known (see, for example, Japanese Unexamined Patent Publication No. 2010-209311). Further, the excitation and emission spectra and the light emission mechanism of a fluoride complex fluorescent material activated by $Mn^{4+}$ have been known (see, for example, "Effective Mn(IV) Emission in Fluoride Coordination", written by A. G. Paulusz, J. Electrochemical Soc., 120 N7, 1973, p. 942-947).

SUMMARY OF THE INVENTION

A method for producing a fluoride fluorescent material, the method comprising:

contacting potassium ions with first complex ions comprising tetravalent manganese ions and second complex ions comprising at least one member selected from the group consisting of elements belonging to Groups 4 and 14 of the Periodic Table in a liquid medium comprising hydrogen fluoride to obtain a dispersion containing fluoride particles represented by the following formula (I):

$$K_2[M_{1-b}Mn^{4+}{}_bF_6] \quad (I)$$

wherein M is the at least one member selected from the group consisting of elements belonging to Groups 4 and 14 of the Periodic Table, and b satisfies the relationship: 0<b<0.2;

adding a reducing agent to the dispersion; and contacting the fluoride particles in the dispersion to which the reducing agent is added with at least one of additional second complex ions and additional potassium ions in the presence of hydrogen fluoride to obtain a fluoride fluorescent material.

The method for producing a fluoride fluorescent material can provide a red light-emitting fluorescent material having excellent water resistance.

DETAILED DESCRIPTION OF THE INVENTION

Figure 1:
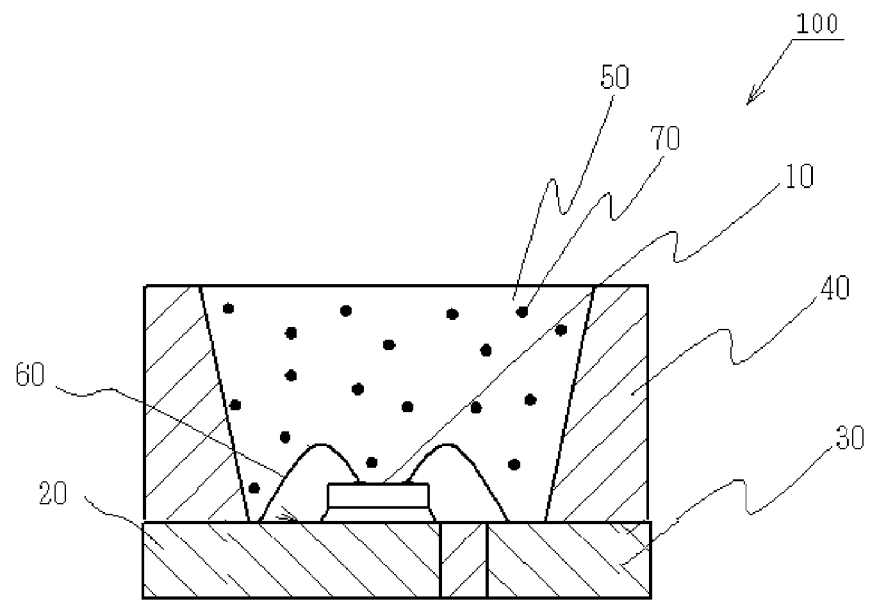
FIG. 1 is a diagrammatic cross-sectional view showing an example of the light emitting device according to the present embodiment.

The above-mentioned red light-emitting fluoride fluorescent materials activated by tetravalent manganese ions exhibiting an emission spectrum having a narrow half band width and light emitting devices using them are considered advantageous particularly to the application of backlight for liquid crystal, and desired to be brought into practical use. However, the conventional fluoride fluorescent materials activated by tetravalent manganese ions are not satisfactory in water resistance and thus have a problem about the long-term reliability.

In view of the above-mentioned problems accompanying the conventional techniques, the present invention has been made. It is a primary object of the present invention to provide a red light-emitting fluorescent material having excellent water resistance and a method for producing the same as well as a light emitting device using the same.

The present inventors have conducted extensive and intensive studies with a view toward solving the above-mentioned problems. As a result, the present invention has been completed. The present invention involves the following embodiments.

An embodiment is a method for producing a fluoride fluorescent material, wherein the method comprises:

contacting potassium ions with first complex ions comprising tetravalent manganese ions and second complex ions comprising at least one member selected from the group consisting of elements belonging to Groups 4 and 14 of the Periodic Table in a liquid medium comprising hydrogen fluoride to obtain a dispersion containing fluoride particles represented by the following formula (I):

$$K_2[M_{1-b}Mn^{4+}{}_bF_6] \qquad (I)$$

wherein M is the at least one member selected from the group consisting of elements belonging to Groups 4 and 14 of the Periodic Table, and b satisfies the relationship: 0<b<0.2;

adding a reducing agent to the dispersion; and contacting the fluoride particles in the dispersion to which the reducing agent is added with at least one of additional second complex ions and additional potassium ions in the presence of hydrogen fluoride to obtain a fluoride fluorescent material.

In other words, the embodiment is a method for producing a fluoride fluorescent material, wherein the method comprises: the first step of contacting, in a liquid medium comprising hydrogen fluoride, first complex ions comprising tetravalent manganese ions, potassium ions, and second complex ions comprising at least one member selected from the group consisting of elements belonging to Groups 4 and 14 of the Periodic Table with one another to obtain a dispersion containing fluoride particles represented by the formula (I) below; the second step of adding a reducing agent to the dispersion; and the third step of contacting the fluoride particles in the dispersion having added thereto the reducing agent with the second complex ions and potassium ions in the presence of hydrogen fluoride to obtain a fluoride fluorescent material.

$$K_2[M_{1-b}Mn^{4+}{}_bF_6] \qquad (I)$$

Wherein M is at least one member selected from the group consisting of elements belonging to Groups 4 and 14 of the Periodic Table, and b satisfies the relationship: 0<b<0.2.

Another embodiment of the present invention is a fluoride fluorescent material produced by the above-mentioned method.

Still another embodiment of the present invention is a light emitting device comprising: a light source that generates light in the wavelength range of from 380 to 485 nm; and the above-mentioned fluoride fluorescent material.

Still further another embodiment of the present invention is an image display apparatus comprising the above-mentioned light emitting device.

In the present invention, there can be provided a red light-emitting fluorescent material having excellent water resistance and a method for producing the same as well as a light emitting device using the same.

Hereinbelow, an embodiment of the present invention will be described in detail. The embodiment described below exemplifies the fluoride fluorescent material, method for producing the same, and light emitting device for specifically showing the technical idea of the present embodiment, and the present embodiment is not limited to the following fluoride fluorescent material, method for producing the same, and light emitting device.

The relationship between the color names and the chromaticity coordinates, the relationship between the wavelength ranges of light and the color names of monochromatic light, and others are according to JIS Z8110. Specifically, a wavelength range of 380 to 455 nm corresponds to bluish violet, 455 to 485 nm corresponds to blue, 485 to 495 nm corresponds to bluish green, 495 to 548 nm corresponds to green, 548 to 573 nm corresponds to yellowish green, 573 to 584 nm corresponds to yellow, 584 to 610 nm corresponds to yellowish red, and 610 to 780 nm corresponds to red.

In the present specification, the term "step" means not only an independent step but also a step which cannot be clearly distinguished from the other steps but can achieve the desired object thereof. The range of values expressed using "to" indicates a range which includes the figures shown before and after "to" as, respectively, the minimum value and the maximum value. Further, with respect to the amount of a component contained in the composition, when a plurality of materials are present in the composition as the components of the composition, the amount of the components means the total amount of the materials present in the composition unless otherwise specified.

<Method for Producing a Fluoride Fluorescent Material>

The method for producing a fluoride fluorescent material of the present embodiment comprises: the first step of contacting, in a liquid medium comprising hydrogen fluoride, first complex ions comprising tetravalent manganese ions, potassium ions, and second complex ions comprising at least one member selected from the group consisting of elements belonging to Groups 4 and 14 of the Periodic Table with one another to obtain a dispersion containing fluoride particles represented by the formula (I) below; the second step of adding a reducing agent to the dispersion; and the third step of contacting the fluoride particles in the dispersion having added thereto the reducing agent with the second complex ions and potassium ions in the presence of hydrogen fluoride to obtain a fluoride fluorescent material.

$$K_2[M_{1-b}Mn^{4+}{}_bF_6] \qquad (I)$$

Wherein M is at least one member selected from the group consisting of elements belonging to Groups 4 and 14 of the Periodic Table, and b satisfies the relationship: 0<b<0.2.

In the method comprising the first to third steps, there is no need to isolate an intermediate during the process, and a fluoride fluorescent material can be produced in 1 pot, and therefore the operating efficiency is excellent. Further, it is easy to control the particle diameter and particle form of the fluoride fluorescent material obtained, and therefore an increase of the viscosity of the dispersion during the production process is suppressed, preventing a lowering of the handling properties.

With respect to the fluoride fluorescent material obtained by the above-mentioned method, it is considered that the concentration of tetravalent manganese ions in the surface region of the fluorescent material particles is lower than the concentration of tetravalent manganese ions in the inner region. By the above-mentioned method, the distribution and concentration of tetravalent manganese ions in the surface region can be easily controlled, making it possible to efficiently produce a fluoride fluorescent material having excellent water resistance and excellent light emission properties.

The fluoride fluorescent material produced by the method comprising the first to third steps is a red light-emitting fluorescent material exhibiting an emission spectrum having a narrow half band width, and has excellent water resistance, and can exhibit satisfactory durability in a long-term reliability test. The reason for this can be presumed, for example, as follows.

Generally, in the fluoride fluorescent material represented by the formula (I), it is considered that tetravalent manganese ions constituting the fluoride fluorescent material react with water in the surface region of the particles to form manganese dioxide, so that the surface of the particles is colored black, lowering the luminance. For this reason, the fluoride fluorescent material cannot achieve satisfactory durability in a long-term reliability test, and has a problem in that it is difficult to apply the fluoride fluorescent material to the use which requires high reliability.

By contrast, in the fluoride fluorescent material produced by the method of the present invention, the concentration of tetravalent manganese ions in the surface region of the fluoride fluorescent material particles is lower than the concentration of tetravalent manganese ions in the inner region of the particles. Therefore, it is considered that the formation of manganese dioxide in the surface of the particles is suppressed, so that a lowering of the luminance can be suppressed for a long term. For this reason, it is considered that excellent long-term reliability can be achieved.

[First Step]

In the first step, in a liquid medium comprising hydrogen fluoride, the first complex ions comprising tetravalent manganese ions, potassium ions, and the second complex ions comprising at least one member selected from the group consisting of elements belonging to Groups 4 and 14 of the Periodic Table are contacted with one another to obtain a dispersion containing fluoride particles represented by the following formula (I).

$$K_2[M_{1-b}Mn^{4+}{}_bF_6] \quad (I)$$

In the above formula, M is at least one member selected from the group consisting of elements belonging to Groups 4 and 14 of the Periodic Table. It is preferred that M is at least one member selected from the group consisting of titanium (Ti), zirconium (Zr), hafnium (Hf), silicon (Si), germanium (Ge), and tin (Sn). It is further preferred that M comprises silicon (Si), or silicon (Si) and germanium (Ge).

With respect to b, there is no particular limitation as long as b satisfies the relationship: $0<b<0.2$, and b can be appropriately selected according to, e.g., intended light emission properties. b can be adjusted to a desired range by, for example, controlling the concentration of the first complex ions in the liquid medium.

With respect to the method for contacting the first complex ions, potassium ions, and the second complex ions with one another, there is no particular limitation. For example, there can be mentioned a method in which a first solution containing the first complex ions, a second solution containing potassium ions, and a third solution containing the second complex ions are mixed with each other. In this case, hydrogen fluoride may be contained in any of the first to third solutions, or the first to third solutions may be mixed in a liquid medium comprising hydrogen fluoride.

From the viewpoint of achieving excellent formation efficiency of the fluoride particles and excellent light emission properties, the first step preferably comprises mixing together a first solution containing the first complex ions, a second solution containing potassium ions, and a third solution containing the second complex ions, more preferably comprises mixing together a first solution containing the first complex ions and hydrogen fluoride, a second solution containing potassium ions and hydrogen fluoride, and a third solution containing the second complex ions.

(First Solution)

The first solution (hereinafter, also referred to as "solution A") contains at least the first complex ions comprising tetravalent manganese ions, and may contain another component if necessary. It is preferred that the first solution further contains hydrogen fluoride in addition to the first complex ions.

The first solution is obtained in the form of, for example, an aqueous solution of hydrofluoric acid containing a manganese ion source. With respect to the manganese ion source, there is no particular limitation as long as it is a compound forming tetravalent manganese ions. Specific examples of manganese ion sources which can constitute the first solution include $K_2MnF_6$, $KMnO_4$, and $K_2MnCl_6$. Of these, preferred is $K_2MnF_6$ because, for example, $K_2MnF_6$ does not contain chlorine which is likely to strain the crystal lattice to cause the crystal to be unstable, and $K_2MnF_6$ can be stably present as $MnF_6$ complex ions in hydrofluoric acid while maintaining the oxidation number (tetravalent) which can achieve activation. Among the tetravalent manganese ion sources, one containing potassium can serve also as a potassium source contained in the second solution.

With respect to the tetravalent manganese ion source constituting the first solution, a single type may be used, or two or more types may be used in combination.

With respect to the concentration of the first complex ions in the first solution, there is no particular limitation. The lower limit of the first complex ion concentration of the first solution is, for example, 0.1% by weight or more, preferably 0.3% by weight or more, more preferably 0.5% by weight or more. Further, the upper limit of the first complex ion concentration of the first solution is, for example, 5% by weight or less, preferably 3% by weight or less, more preferably 2% by weight or less. The first complex ion concentration can be determined by making a calculation from the amounts of the components charged upon preparing the first solution. The concentration of each component in the solution shown below is similarly determined.

When the first solution contains hydrogen fluoride, the lower limit of the hydrogen fluoride concentration of the first solution is, for example, 30% by weight or more, preferably 35% by weight or more, more preferably 40% by weight or more. Further, the upper limit of the hydrogen fluoride concentration of the first solution is, for example, 70% by weight or less, preferably 65% by weight or less, more preferably 60% by weight or less. When the hydrogen fluoride concentration is 30% by weight or more, the tetravalent manganese ion source (for example, $K_2MnF_6$) constituting the first solution is improved in the stability to hydrolysis, so that a change of the tetravalent manganese ion concentration of the first solution is suppressed. Thus, it is likely that the amount of the manganese for activation contained in the obtained fluoride fluorescent material can be easily controlled, making it possible to suppress variation (change) of the light emission efficiency of the fluoride fluorescent material. On the other hand, when the hydrogen fluoride concentration is 70% by weight or less, a lowering of the boiling point of the first solution is suppressed, so that the generation of hydrogen fluoride gas is suppressed. Thus, the hydrogen fluoride concentration of the first solution can be easily controlled, making it possible to effectively suppress variation (change) of the particle diameter of the obtained fluoride fluorescent material.

The first solution may, in addition to the first complex ions, further contain the second complex ions comprising at least one member selected from the group consisting of elements belonging to Groups 4 and 14 of the Periodic Table. The second complex ions and preferred modes thereof are described in detail below.

When the first solution contains the second complex ions in addition to the first complex ions, the lower limit of the second complex ion concentration of the first solution is not particularly limited, and may be, for example, 1% by weight or more. The upper limit of the second complex ion concentration of the first solution is, for example, 30% by weight or less, preferably 25% by weight or less, more preferably 20% by weight or less. When the second complex ion concentration of the first solution is 30% by weight or less, it is likely that more excellent emission luminance is obtained.

(Second Solution)

The second solution (hereinafter, also referred to as "solution B") contains at least potassium ions, and may contain another component if necessary. It is preferred that the second solution further contains hydrogen fluoride in addition to potassium ions.

The second solution is obtained in the form of, for example, an aqueous solution of hydrofluoric acid containing potassium ions. Specific examples of potassium sources containing potassium ions which can constitute the second solution include water-soluble potassium salts, such as KF, $KHF_2$, KOH, KCl, KBr, KI, $CH_3COOK$ (potassium acetate), and $K_2CO_3$. Of these, preferred is $KHF_2$ because $KHF_2$ can be dissolved without lowering the hydrogen fluoride concentration of the solution, and further has small heat of dissolution and hence achieves high safety.

With respect to the potassium source constituting the second solution, a single type may be used, or two or more types may be used in combination.

The lower limit of the potassium ion concentration of the second solution is, for example, 10% by weight or more, preferably 12.5% by weight or more, more preferably 15% by weight or more. Further, the upper limit of the potassium ion concentration of the second solution is, for example, 35% by weight or less, preferably 32.5% by weight or less, more preferably 30% by weight or less. When the potassium ion concentration is 10% by weight or more, it is likely that the yield of the fluoride fluorescent material is improved. On the other hand, when the potassium ion concentration is 35% by weight or less, it is likely that the obtained fluoride fluorescent material has an increased particle diameter.

When the second solution contains hydrogen fluoride, the lower limit of the hydrogen fluoride concentration of the second solution is, for example, 30% by weight or more, preferably 35% by weight or more, more preferably 40% by weight or more. Further, the upper limit of the hydrogen fluoride concentration of the second solution is, for example, 70% by weight or less, preferably 65% by weight or less, more preferably 60% by weight or less.

(Third Solution)

The third solution (hereinafter, also referred to as "solution C") contains at least the second complex ions comprising at least one member selected from the group consisting of elements belonging to Groups 4 and 14 of the Periodic Table, and may contain another component if necessary. It is preferred that the second complex ions further comprise fluorine ions in addition to the at least one member selected from the group consisting of elements belonging to Groups 4 and 14 of the Periodic Table.

The third solution is obtained in the form of, for example, an aqueous solution containing the second complex ions.

The second complex ions preferably comprise at least one member selected from the group consisting of titanium (Ti), zirconium (Zr), hafnium (Hf), silicon (Si), germanium (Ge), and tin (Sn), more preferably comprise silicon (Si), or silicon (Si) and germanium (Ge), further preferably are silicon fluoride complex ions.

For example, when the second complex ions comprise silicon (Si), the second complex ion source is preferably a compound containing silicon and fluorine ions and having excellent solubility in the solution. Specific examples of second complex ion sources include $H_2SiF_6$, $Na_2SiF_6$, $(NH_4)_2SiF_6$, $Rb_2SiF_6$, and $Cs_2SiF_6$. Of these, $H_2SiF_6$ is preferred because $H_2SiF_6$ has high solubility in water and contains no alkali metal element as an impurity.

With respect to the second complex ion source constituting the third solution, a single type may be used, or two or more types may be used in combination.

The lower limit of the second complex ion concentration of the third solution is, for example, 10% by weight or more, preferably 15% by weight or more, more preferably 20% by weight or more. Further, the upper limit of the second complex ion concentration of the third solution is, for example, 60% by weight or less, preferably 55% by weight or less, more preferably 50% by weight or less.

With respect to the method for mixing the first solution, second solution, and third solution, there is no particular limitation, and, while stirring the first solution, the second solution and third solution may be added to the first solution, while stirring the third solution, the first solution and second solution may be added to the third solution, or, while stirring the second solution, the first solution and third solution may be added to the second solution. Alternatively, the first solution, second solution, and third solution may be individually placed in a vessel and mixed with each other by stirring.

Of these, from the viewpoint of efficiently obtaining the fluoride particles, the method for mixing the first solution, second solution, and third solution is preferably a method in which, while stirring the first solution, the second solution and third solution are added to the first solution.

Mixing means for mixing the first solution, second solution, and third solution can be appropriately selected from mixing means generally used according to, e.g., the reaction vessel.

With respect to the temperature at which the first solution, second solution, and third solution are mixed together, there is no particular limitation. For example, the solutions can be mixed together at a temperature in the range of from 15 to 40° C., preferably at a temperature in the range of from 23 to 28° C.

Further, with respect to the atmosphere for the mixing, there is no particular limitation. The mixing may be performed in general air or in an atmosphere of an inert gas, such as nitrogen gas.

With respect to the solids content of the dispersion obtained in the first step, there is no particular limitation as long as the dispersion can be stirred. The solids content of the dispersion can be, for example, 2 to 40% by weight, preferably 5 to 20% by weight.

The solids content of the dispersion can be determined by separating the fluoride particles from the dispersion by solid-liquid separation and measuring a weight of the solids.

[Second Step]

In the second step, a reducing agent is added to the dispersion containing the fluoride particles obtained in the first step. It is preferred that, by adding a reducing agent, at least part of the first complex ions contained in the dispersion are reduced to bivalent manganese ions. In the second step, 90 mol % or more of the first complex ions are preferably reduced, more preferably, 95 mol % or more of the first complex ions are reduced.

With respect to the reducing agent, there is no particular limitation as long as it can reduce the first complex ions. Specific examples of reducing agents include hydrogen peroxide and oxalic acid.

Of these, preferred is hydrogen peroxide because hydrogen peroxide can reduce the first complex ions and has less influence on the fluoride particles, for example, hydrogen peroxide is unlikely to dissolve the fluoride particles, and hydrogen peroxide is finally decomposed into water and oxygen, and hence can be easily used in the production process and causes less load on the environment.

With respect to the amount of the reducing agent added, there is no particular limitation. The amount of the reducing agent added can be appropriately selected according to, for example, the content of the first complex ions in the dispersion, and a preferred amount of the reducing agent added is such that the hydrogen fluoride concentration of the dispersion suffers less change. The amount of the reducing agent added is, specifically, preferably 3 equivalent % or more, more preferably 5 equivalent % or more, based on the amount of the first complex ions contained in the dispersion other than the fluoride particles.

1 equivalent means mole(s) of the reducing agent required to reduce 1 mole of the first complex ions to bivalent manganese ions.

The second step may comprise, after adding a reducing agent to the dispersion, mixing the dispersion with the reducing agent. Mixing means for mixing the dispersion with the reducing agent can be appropriately selected from mixing means generally used according to, e.g., the reaction vessel.

With respect to the temperature in the second step, there is no particular limitation. For example, the reducing agent can be added at a temperature in the range of from 15 to 40° C., preferably at a temperature in the range of from 23 to 28° C.

Further, with respect to the atmosphere in the second step, there is no particular limitation. The reducing agent may be added in general air atmosphere or in an atmosphere of an inert gas, such as nitrogen gas.

[Third Step]

In the third step, the fluoride particles in the dispersion having added thereto the reducing agent are contacted with the second complex ions and potassium ions in the presence of hydrogen fluoride to obtain a fluoride fluorescent material. By contacting the fluoride particles with the second complex ions and potassium ions in the presence of hydrogen fluoride, for example, a fluoride comprising at least element selected from the group consisting of elements belonging to Groups 4 and 14 of the Periodic Table contained in the second complex ions and potassium is deposited on the surface of the fluoride particles, so that a desired fluoride fluorescent material is obtained.

The third step may be independently performed after the second step, or the third step may be started after the start of the second step and before the termination of the second step so that the second step is performed in parallel with the third step partially.

The fluoride fluorescent material obtained in the third step is formed by contacting the fluoride particles represented by the formula (I) with the second complex ions and potassium ions, and preferably has a composition represented by the following formula (II). In the following formula, M is at least one member selected from the group consisting of elements belonging to Groups 4 and 14 of the Periodic Table, and a satisfies the relationship: 0<a<b.

$$K_2[M_{1-a}Mn^{4+}{}_aF_6] \quad (II)$$

With respect to a and b, there is no particular limitation as long as a and b satisfy the relationship: 0<a<b. The value a can be appropriately selected according to, e.g., intended light emission properties and water resistance. Further, the value a can be controlled by, for example, adjusting the amount of the second complex ions and potassium ions contacted with the fluoride particles in the third step.

In the third step, with respect to the method for contacting the fluoride particles in the dispersion having added thereto the reducing agent with the second complex ions and potassium ions, there is no particular limitation. For example, a preferred method is that the dispersion having added thereto the reducing agent is mixed with at least one of a solution containing potassium ions and a solution containing the second complex ions, a more preferred method is that the dispersion having added thereto the reducing agent is mixed with at least one of the second solution and third solution, and a further preferred method is that the dispersion having added thereto the reducing agent, the second solution, and the third solution are mixed with each other. Preferred embodiments of the second solution and third solution are as described above.

When the dispersion is mixed with one of a solution containing potassium ions and a solution containing the second complex ions, the potassium ions or the second complex ions, which are not contained in the solution to be mixed with the dispersion, may be contained in the dispersion in an amount required for the third step.

The second solution and third solution in the third step and the second solution and third solution in the first step may have the same composition or different compositions.

When the third step comprises mixing the dispersion having added thereto the reducing agent with at least one of a solution containing potassium ions and a solution containing the second complex ions, mixing means can be appropriately selected from mixing means generally used according to, e.g., the reaction vessel.

With respect to the temperature in the third step, there is no particular limitation. For example, the third step can be performed at a temperature in the range of from 15 to 40° C., preferably at a temperature in the range of from 23 to 28° C.

Further, with respect to the atmosphere in the third step, there is no particular limitation. The third step may be performed in general air atmosphere or in an atmosphere of an inert gas, such as nitrogen gas.

When the third step comprises mixing the dispersion having added thereto the reducing agent with at least one of a solution containing potassium ions and a solution containing the second complex ions, the amount of the solution containing the second complex ions and the solution containing potassium ions added relative to the fluoride particles in the dispersion having added thereto the reducing agent can be appropriately selected according to, e.g., intended light emission properties and water resistance of the fluoride fluorescent material. For example, the amount of the second complex ions added relative to the fluoride particles can be 1 to 40 mol %, preferably 5 to 30 mol %.

[Other Steps]

The method for producing a fluoride fluorescent material may further comprise another step if necessary. For example, the fluoride fluorescent material formed in the third step can be recovered by solid-liquid separation, such as filtration. The fluoride fluorescent material may be washed with a solvent, such as ethanol, isopropyl alcohol, water, or acetone. Further, the fluoride fluorescent material may be subjected to drying treatment. In such a case, the fluoride fluorescent material is dried at, for example, 50° C. or higher, preferably 55° C. or higher, more preferably 60° C. or higher, and at, for example, 110° C. or lower, preferably 100° C. or lower, more preferably 90° C. or lower. With respect to the time for drying, there is no particular limitation as long as the moisture attached to the fluoride fluorescent material can be evaporated, and the drying time is, for example, about 10 hours.

<Fluoride Fluorescent Material>

The fluoride fluorescent material of the present invention is produced by the above-mentioned method. The fluoride fluorescent material is represented by the formula (II), and has an inner region formed mainly in the first step, and a surface region formed mainly in the third step, in which the concentration of tetravalent manganese ions is lower than the concentration of tetravalent manganese ions in the inner region. It is preferred that the fluoride fluorescent material collectively has a composition represented by the formula (II).

The fluoride fluorescent material of the present invention has excellent water resistance, and is excited by a light having a wavelength of a visible light on the short wavelength side to emit light in the red range. Further, the fluoride fluorescent material exhibiting an emission spectrum having a narrow half band width is realized.

The surface region of the fluoride fluorescent material has a lower tetravalent manganese ion concentration than that of the inner region. The surface region may be a mode in which the surface region is separate from the inner region through a definite interface as in a layered structure, or may be a mode in which the surface region is not separate from the inner region through a definite interface and the tetravalent manganese ion concentration is gradually lowered in the direction of from the inside to the outside of the surface region.

In the fluoride fluorescent material obtained by the above-mentioned method, the whole of the particles are a fluoride fluorescent material activated by tetravalent manganese ions, which maintains properties of a color reproduction range wider than that obtained using a conventional fluoride fluorescent material, and, even when the surface of the fluoride fluorescent material particles is dissolved out in moisture, no or less tetravalent manganese ions are present in the surface region, and hence the formation of manganese dioxide derived from tetravalent manganese ions is suppressed. Thus, the surface of the fluoride fluorescent material particles is prevented from being colored black, making it possible to suppress a lowering of the light emission intensity.

The average of the concentration of tetravalent manganese ions present in the surface region of the fluoride fluorescent material is preferably 30% by weight or less of the average of the concentration of tetravalent manganese ions in the inner region. Further, the concentration of tetravalent manganese ions present in the surface region is more preferably 25% by weight or less, further preferably 20% by weight or less of the concentration of tetravalent manganese ions in the inner region. On the other hand, the concentration of tetravalent manganese ions in the surface region can be 0.5% by weight or more of the concentration of tetravalent manganese ions in the inner region. As mentioned above, when the tetravalent manganese ion concentration is close to zero, the water resistance is improved. However, as the concentration of tetravalent manganese ions in the surface region is reduced, it is likely that the proportion of the region, which does not contribute to light emission, in the surface region of the fluoride fluorescent material particles is increased, lowering the light emission intensity.

The thickness of the surface region varies depending on the particle diameter of the fluoride fluorescent material, but is preferably about $1/10$ to $1/50$ of the average particle diameter of the fluoride fluorescent material. For example, when the fluoride fluorescent material particles collectively have an average particle diameter of 20 to 40 μm, the thickness of the surface region is 2 μm or less.

The fluoride fluorescent material is prepared so that, when immersed in pure water having a weight 1 to 5 times the weight of the fluoride fluorescent material, the amount of the tetravalent manganese ions dissolved at 25° C. becomes, for example, in the range of from 0.05 to 3 ppm. The amount of the tetravalent manganese ions dissolved under the above conditions is preferably in the range of from 0.1 to 2.5 ppm, further preferably in the range of from 0.2 to 2.0 ppm. This is because, as the amount of the tetravalent manganese ion dissolved is reduced, the water resistance is improved, but, as mentioned above, it is likely that when the proportion of the surface region having reduced tetravalent manganese ions is increased, the light emission intensity is lowered. The amount of the manganese ions dissolved can be determined by a method in which the fluoride fluorescent material is immersed in pure water having a weight 1 to 5 times (preferably 3 times) the weight of the fluoride fluorescent material, and stirred at 25° C. for one hour, and then a reducing agent is added thereto and the resultant supernatant having dissolved therein manganese ions is taken out, and subjected to quantitative analysis by ICP emission spectrometry.

By virtue of having the above-mentioned construction of the fluoride fluorescent material, when the fluoride fluorescent material is in contact with water, a lowering of the emission luminance caused by coloring due to the formation of manganese dioxide derived from tetravalent manganese ions can be suppressed, realizing the fluoride fluorescent material having high water resistance.

The water resistance of the fluoride fluorescent material can be evaluated by, for example, an emission luminance maintaining ratio after the water resistance test, i.e., a ratio (%) of the emission luminance after the water resistance test to the emission luminance before the water resistance test. The emission luminance maintaining ratio after the water resistance test is preferably 85% or more, more preferably 90% or more.

The water resistance test is conducted, specifically, by immersing the fluoride fluorescent material in water having a weight 1 to 5 times (preferably 3 times) the weight of the fluorescent material, and stirring the resultant water at 25° C. for one hour.

<Light Emitting Device>

The light emitting device of the present embodiment comprises a light source that generates light in the wavelength range of from 380 to 485 nm, and the fluoride fluorescent material. The light emitting device may further comprise another constituent member if necessary. By virtue of having the fluoride fluorescent material, the light emitting device can achieve excellent long-term reliability. The light emitting device can be preferably applied to a light source for a liquid crystal display apparatus.

(Light Source)

As a light source (hereinafter, also referred to as "excitation light source"), a light source that generates light in the wavelength range of from 380 to 485 nm, which is the short wavelength region of a visible light, is used. The light source preferably has an emission peak wavelength (maximum emission wavelength) in the wavelength range of from 420 to 485 nm, more preferably in the wavelength range of from 440 to 480 nm. By using such a light source, the fluoride fluorescent material can be efficiently excited, and thus a visible light can be effectively utilized. Further, by using an excitation light source having the above-mentioned wavelength range, a light emitting device having high light emission intensity can be provided.

It is preferred that, as the excitation light source, a semiconductor light emitting element (hereinafter, also referred to simply as "light emitting element") is used. By using a semiconductor light emitting element as the excitation light source, there can be obtained a light emitting device which has high efficiency and high linearity of the output with respect to the input and which is resistant to a mechanical impact and stable.

With respect to the light emitting element, one that generates light having a wavelength of a visible light on the short wavelength side can be used. For example, as a blue or green light emitting element, one using a nitride Semiconductor ($In_XAl_YGa_{1-X-Y}N$, $0 \leq X$, $0 \leq Y$, $X+Y \leq 1$) can be used.

(Fluoride Fluorescent Material)

The details of the fluoride fluorescent material in the light emitting device are as mentioned above. The fluoride fluorescent material can constitute the light emitting device by, for example, being contained in an encapsulation resin covering the excitation light source. In the light emitting device having the excitation light source covered by an encapsulation resin containing the fluoride fluorescent material, part of the light emitted from the excitation light source is absorbed by the fluoride fluorescent material and emitted as a red light. By using the excitation light source that generates light in the wavelength range of from 380 to 485 nm, the emitted light can be more effectively utilized. Thus, a loss of the light emitted from the light emitting device can be reduced, so that the light emitting device having high efficiency can be provided.

With respect to the amount of the fluoride fluorescent material contained in the light emitting device, there is no particular limitation, and the amount of the fluoride fluorescent material can be appropriately selected according to, e.g., the excitation light source.

(Another Fluorescent Material)

It is further preferred that the light emitting device further comprises, in addition to the fluoride fluorescent material, another fluorescent material. Another fluorescent material may be any fluorescent material which absorbs light from the light source and changes the light in wavelength to light having a different wavelength. Another fluorescent material can constitute the light emitting device like the fluoride fluorescent material by, for example, being contained in an encapsulation resin.

Another fluorescent material is preferably at least one member selected from the group consisting of, for example, nitride fluorescent materials, oxide nitride fluorescent materials, and sialon fluorescent materials, each activated mainly by a lanthanoid element, such as Eu or Ce; alkaline earth halogen apatite fluorescent materials, alkaline earth metal halogen borate fluorescent materials, alkaline earth metal aluminate fluorescent materials, alkaline earth silicates, alkaline earth sulfides, alkaline earth thiogallates, alkaline earth silicon nitrides, and germinates, each activated mainly by a lanthanoid element, such as Eu, or a transition metal element, such as Mn; rare earth aluminates and rare earth silicates, each activated mainly by a lanthanoid element, such as Ce; and inorganic and organic complexes each activated mainly by a lanthanoid element, such as Eu.

Specific examples of other fluorescent materials include $(Ca, Sr, Ba)_2SiO_4:Eu$, $(Y, Gd)_3(Ga, Al)_5O_{12}:Ce$, $(Si, Al)_6(O, N)_8:Eu(\beta\text{-sialon})$, $SrGa_2S_4:Eu$, $(Ca, Sr)_2Si_5N_8:Eu$, $CaAlSiN_3:Eu$, $(Ca, Sr)AlSiN_3:Eu$, $Lu_3Al_5O_{12}:Ce$, and $(Ca, Sr, Ba, Zn)_8MgSi_4O_{16}(F, Cl, Br, I):Eu$.

By using another fluorescent material in the light emitting device, the light emitting device having various color tones can be provided.

When the light emitting device further comprises another fluorescent material, the amount of the fluorescent material contained is not particularly limited, and may be appropriately selected so as to obtain desired light emission properties.

When the light emitting device further comprises another fluorescent material, the light emitting device preferably comprises a green fluorescent material, more preferably a green fluorescent material which absorbs light in the wavelength range of from 380 to 485 nm, and that generates light in the wavelength range of from 495 to 573 nm. The light emitting device comprising a green fluorescent material can be more preferably applied to a liquid crystal display apparatus.

With respect to the form of the light emitting device, there is no particular limitation, and the form can be appropriately selected from forms generally used. As examples of forms of the light emitting device, there can be mentioned a shell type and a surface mount type. Generally, the shell type indicates a light emitting device having a resin which constitutes the outer surface and which is formed into a shell shape. The surface mount type indicates a light emitting device having a container portion in a depressed form filled with a light emitting element as a light source and a resin. As a further example of the form of the light emitting device, there can be mentioned a light emitting device in which a light emitting element as a light source is mounted on a printed circuit board in a flat plate form, and an encapsulation resin containing the fluoride fluorescent material is formed in a lens shape so as to cover the light emitting element.

Figure 2:
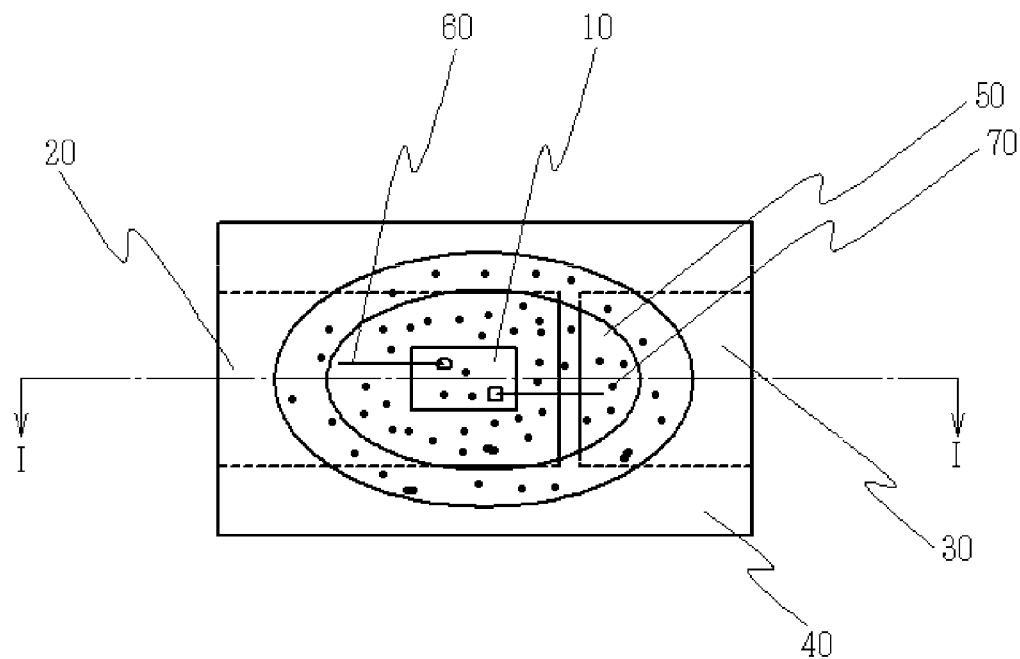
FIG. 2 is a diagrammatic plan view showing an example of the light emitting device according to the present embodiment.

Hereinbelow, an example of the light emitting device according to the present embodiment will be described with reference to the drawings. FIG. 1 is a diagrammatic cross-sectional view showing an example of the light emitting device of the present embodiment. FIG. 2 is a diagrammatic plan view showing an example of the light emitting device of the present embodiment. This light emitting device is an example of a surface mount-type light emitting device.

Light emitting device 100 has light emitting element 10 comprised of a gallium nitride compound semiconductor that generates light having a wavelength of a visible light on the short wavelength side (for example, 380 to 485 nm), and shaped body 40 which has placed thereon light emitting element 10. Shaped body 40 has first lead 20 and second lead 30, and they are integrally molded using a thermoplastic resin or thermosetting resin. Shaped body 40 has formed a depressed portion having a bottom and sides, and has light emitting element 10 placed on the bottom of the depressed portion. Light emitting element 10 has a pair of positive and negative electrodes, and a pair of the positive and negative electrodes are electrically connected to first lead 20 and second lead 30 through wire 60. Light emitting element 10 is encapsulated by encapsulation member 50. As encapsulation member 50, a thermosetting resin, such as an epoxy resin, a silicone resin, an epoxy-modified silicone resin, or a modified silicone resin, is preferably used. Encapsulation member 50 contains fluoride fluorescent material 70 which changes the wavelength of light from light emitting element 10.

<Image Display Apparatus>

The image display apparatus comprises the at least one light emitting device. With respect to the image display apparatus, there is no particular limitation as long as the apparatus comprises the light emitting device, and the apparatus can be appropriately selected from conventionally known image display apparatuses. The image display apparatus has, for example, in addition to the light emitting device, a color filter member and a light transmission control member.

By virtue of having the light emitting device, the image display apparatus exhibits excellent luminance and color reproduction range as well as excellent long-term reliability.

EXAMPLES

Hereinbelow, the present invention will be described in more detail with reference to the following Examples, which should not be construed as limiting the scope of the present invention.

Example 1

21.66 g of $K_2MnF_6$ was weighed and dissolved in 800 g of a 55% by weight aqueous HF solution, and then 400 g of a 40% by weight aqueous $H_2SiF_6$ solution was added to the resultant solution to prepare solution A, so that the charged composition became as shown in Table 1. Separately, 260.14 g of $KHF_2$ was weighed and dissolved in 200 g of a 55% by weight aqueous HF solution to prepare solution B. Further, 200 g of a 40% by weight aqueous $H_2SiF_6$ solution was weighed and used as solution C.

Then, while stirring solution A at room temperature (23 to 28° C.), solution B and solution C were simultaneously added dropwise to solution A to deposit fluorescent material crystals (fluoride particles), and, at a time when the addition of 75% by weight of each of solution B and solution C was achieved as shown in Table 2, the addition of each solution was stopped (first step).

15 g of a 30% aqueous $H_2O_2$ solution was weighed as a reducing agent and added to solution A (second step), and then the addition of solution B and solution C was restarted (third step). After completion of the addition of solution B and solution C, the resultant deposits were separated, and washed with IPA (e.g., isopropyl alcohol), and dried at 70° C. for 10 hours to prepare a fluoride fluorescent material in Example 1.

Example 2

A fluoride fluorescent material in Example 2 was prepared by substantially the same method as the method for the fluoride fluorescent material in Example 1 except that the amount of each of solution B and solution C added until the solution containing a reducing agent was added was changed from 75% by weight to 90% by weight as shown in Table 2.

Examples 3 to 5

Fluoride fluorescent materials in Examples 3 to 5 were individually prepared by substantially the same method as the method for the fluoride fluorescent material in Example 1 except that the charged composition and charged amounts were changed to those shown in Table 1.

Comparative Example 1

21.66 g of $K_2MnF_6$ was weighed and dissolved in 800 g of a 55% by weight aqueous HF solution, and then 400 g of a 40% by weight aqueous $H_2SiF_6$ solution was added to the resultant solution to prepare solution A, so that the charged composition became as shown in Table 1. Separately, 260.14 g of $KHF_2$ was weighed and dissolved in 200 g of a 55% by weight aqueous HF solution to prepare solution B. Further, 200 g of a 40% by weight aqueous $H_2SiF_6$ solution was weighed and used as solution C.

Then, while stirring solution A at room temperature (23 to 28° C.), solution B and solution C were simultaneously added to solution A to deposit fluorescent material crystals, and the addition of solution B and the addition of solution C were completed substantially simultaneously.

The resultant deposits were separated, and then washed with IPA, and dried at 70° C. for 10 hours to prepare a fluoride fluorescent material in Comparative Example 1.

TABLE 1

| | Charged composition (mol) | | | | Solution A Charged amount (g) | | | Solution B Charged amount (g) | Solution C Charged amount (g) | Reducing agent (g) |
|---|---|---|---|---|---|---|---|---|---|---|
| | K | Si | Mn | F | $K_2MnF_6$ | 40% aqueous $H_2SiF_6$ solution | 55% aqueous HF solution | 55% aqueous HF solution | 40% aqueous $H_2SiF_6$ solution | 30% aqueous $H_2O_2$ solution |
| | | | | | | | | $KHF_2$ | | |
| Example 1 | 2 | 0.95 | 0.05 | 6 | 21.66 | 400 | 800 | 260.14 | 450 | 200 | 15 |
| Example 2 | 2 | 0.95 | 0.05 | 6 | 21.66 | 400 | 800 | 260.14 | 450 | 200 | 15 |
| Example 3 | 2 | 0.95 | 0.05 | 6 | 21.66 | 200 | 800 | 260.14 | 450 | 400 | 15 |
| Example 4 | 2 | 0.95 | 0.05 | 6 | 21.66 | 100 | 800 | 260.14 | 450 | 500 | 15 |
| Example 5 | 2 | 0.95 | 0.05 | 6 | 21.66 | 0 | 800 | 260.14 | 450 | 600 | 15 |
| Comparative example 1 | 2 | 0.95 | 0.05 | 6 | 21.66 | 400 | 800 | 260.14 | 450 | 200 | 0 |

TABLE 2

| | Percentage (%) of solution added before adding reducing agent | |
|---|---|---|
| | Solution B | Solution C |
| Example 1 | 75 | 75 |
| Example 2 | 90 | 90 |
| Example 3 | 75 | 75 |
| Example 4 | 75 | 75 |
| Example 5 | 75 | 75 |

(Evaluation of Emission Luminance Characteristics)

With respect to the above-obtained fluoride fluorescent materials in Examples 1 to 5 and Comparative Example 1, prior to a water resistance test, general measurement of the emission luminance characteristics was conducted. The relative emission luminances determined when the emission luminance in Comparative Example 1 measured before a water resistance test is taken as 100.0% are as shown in Table 3 below. The emission luminance characteristics were measured under conditions at an excitation wavelength of 460 nm for a reflective luminance.

(Water Resistance Test)

With respect to the above-obtained fluoride fluorescent materials in Examples 1 to 5 and Comparative Example 1, a water resistance was evaluated. A water resistance test was conducted in which 5 g of the fluorescent material was immersed in 15 g of pure water and stirred at 25° C. for one hour and then, the resultant material was separated and washed with IPA, and dried at 70° C. for 10 hours. Thus, the fluoride fluorescent materials after the water resistance test were individually obtained.

With respect to the fluoride fluorescent materials after the water resistance test, measurement of the emission luminance characteristics was performed in the same manner as mentioned above. The results are shown in Table 3. A ratio of the relative luminance after the water resistance test to the relative luminance before the water resistance test is also shown as a luminance maintaining ratio (%).

TABLE 3

| | Emission luminance characteristics | | | Emission luminance characteristics after water resistance test | | | |
|---|---|---|---|---|---|---|---|
| | Chromaticity coordinates | | Relative luminance | Chromaticity coordinates | | Relative luminance | Luminance maintaining |
| | x | y | (%) | x | y | (%) | ratio (%) |
| Example 1 | 0.678 | 0.312 | 88.3 | 0.678 | 0.312 | 83.1 | 94.1 |
| Example 2 | 0.678 | 0.312 | 90.1 | 0.678 | 0.312 | 80.5 | 89.3 |
| Example 3 | 0.678 | 0.312 | 100.9 | 0.678 | 0.312 | 92.7 | 91.9 |
| Example 4 | 0.678 | 0.312 | 107.0 | 0.678 | 0.312 | 105.0 | 98.1 |
| Example 5 | 0.678 | 0.312 | 107.3 | 0.678 | 0.312 | 98.3 | 91.6 |
| Comparative example 1 | 0.678 | 0.312 | 100.0 | 0.678 | 0.312 | 74.9 | 74.9 |

As apparent from Table 3, the fluoride fluorescent material having no surface region in Comparative Example 1 had an emission luminance lowered to 74.9%. By contrast, the fluoride fluorescent materials in all the Examples achieved a luminance maintaining ratio of 89% or more, which has confirmed the utility of the present invention.

The fluoride fluorescent material of the present invention and the light emitting device using the same can be used in, for example, a fluorescent character display tube, a display, a PDP, a CRT, an FL, an FED, and a projector tube, particularly, in a backlight light source using a blue light emitting diode as a light source and having extremely excellent light emission properties and long-term reliability, an LED display, a light source for white lighting, a signal, a light switch, and various types of sensors and indicators, and especially in the use of display, they exhibit excellent light emission properties and long-term reliability.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a fluoride fluorescent material, the method consisting essentially of:
    contacting potassium ions with first complex ions comprising tetravalent manganese ions and second complex ions comprising at least one member selected from the group consisting of elements belonging to Groups 4 and 14 of the Periodic Table in a liquid medium comprising hydrogen fluoride to obtain a dispersion in a reaction vessel containing fluoride particles represented by the following formula (I):

$$K_2[M_{1-b}Mn^{4+}{}_bF_6] \qquad (I)$$

wherein M is the at least one member selected from the group consisting of elements belonging to Groups 4 and 14 of the Periodic Table, and b satisfies the relationship: 0<b<0.2;
    adding a reducing agent to the dispersion in the reaction vessel to reduce at least a portion of the tetravalent manganese ions in the dispersion to manganese ions having lower valence; and
    contacting the fluoride particles in the dispersion to which the reducing agent is added with at least one of additional second complex ions and additional potassium ions in the presence of hydrogen fluoride in the reaction vessel to form and deposit a fluoride material on the fluoride particles to obtain a fluoride fluorescent material.

2. The method according to claim 1, wherein the obtained fluoride fluorescent material includes the fluoride fluorescent material represented by the following formula (II):

$$K_2[M_{1-a}Mn^{4+}{}_aF_6] \qquad (II)$$

wherein M is the at least one member selected from the group consisting of elements belonging to Groups 4 and 14 of the Periodic Table, and a satisfies the relationship: 0<a<b.

3. The method according to claim 1, wherein M is at least one member selected from the group consisting of titanium (Ti), zirconium (Zr), hafnium (Hf), silicon (Si), germanium (Ge), and tin (Sn).

4. The method according to claim 1, wherein potassium ions are brought into contact with the first complex ions and the second complex ions by mixing a solution containing potassium ions with a solution containing the first complex ions and a solution containing the second complex ions.

5. The method according to claim 1, wherein addition of the reducing agent reduces at least a portion of the first complex ions to bivalent manganese ions.

6. The method according to claim 1, wherein the dispersion to which the reducing agent has been added is mixed with at least one of a second solution containing potassium ions and a second solution containing the second complex ions.

7. The method according to claim 1, wherein the second complex ions comprise silicon, or silicon and germanium.

8. The method according to claim 1, wherein adding the reducing agent to the dispersion and contacting the fluoride particles with the at least one of additional second complex ions and additional potassium ions are performed at least partially in parallel.

* * * * *